United States Patent
Opansky et al.

(10) Patent No.: US 7,490,878 B1
(45) Date of Patent: Feb. 17, 2009

(54) ESD SAFE VACUUM WAND TIP

(75) Inventors: Brian Joseph Opansky, Boulder, CO (US); Wayne Boone, Northglenn, CO (US)

(73) Assignee: Storage Technology Corporation, Louisville, CO (US)

( * ) Notice: Subject to any disclaimer, the term of this patent is extended or adjusted under 35 U.S.C. 154(b) by 1057 days.

(21) Appl. No.: 10/747,469

(22) Filed: Dec. 29, 2003

(51) Int. Cl.
*H01B 3/12* (2006.01)

(52) U.S. Cl. ............... 294/1.1; 294/64.1; 414/935; 414/941

(58) Field of Classification Search ............ 294/64.1, 294/1.1; 414/935, 941
See application file for complete search history.

(56) References Cited

U.S. PATENT DOCUMENTS

| | | | | |
|---|---|---|---|---|
| 4,735,449 A | * | 4/1988 | Kuma | 294/64.3 |
| 4,847,729 A | * | 7/1989 | Hee | 361/220 |
| 5,280,979 A | * | 1/1994 | Poli et al. | 294/64.1 |
| 5,611,452 A | * | 3/1997 | Bonora et al. | 220/378 |
| 5,691,875 A | * | 11/1997 | Dangelmayer et al. | 361/222 |
| 5,855,036 A | * | 1/1999 | Krock | 15/420 |
| 6,180,291 B1 | * | 1/2001 | Bessy et al. | 430/5 |
| 6,199,927 B1 | * | 3/2001 | Shamlou et al. | 294/64.1 |
| 6,232,578 B1 | * | 5/2001 | Klebanoff et al. | 219/228 |
| 6,421,113 B1 | * | 7/2002 | Armentrout | 355/75 |
| 6,530,613 B2 | * | 3/2003 | Uematsu et al. | 294/64.1 |
| 2003/0173189 A1 | * | 9/2003 | Chen et al. | 198/493 |

FOREIGN PATENT DOCUMENTS

JP          63133644 A   *   6/1988

* cited by examiner

*Primary Examiner*—Michael S Lowe
(74) *Attorney, Agent, or Firm*—Brooks Kushman P.C.

(57) ABSTRACT

A device for safely handling electrically sensitive objects. A grounded dissipative material is used to form a handling surface so that electrically charged objects handled by the wand can slowly discharge without becoming damaged.

15 Claims, 1 Drawing Sheet

ESD SAFE VACUUM WAND TIP

BACKGROUND OF THE INVENTION

1. Field of the Invention

The present invention relates generally to handling of sensitive electrical equipment, and particularly to the proper handling of electronic devices at the wafer level, which are sensitive to electrostatic discharge (ESD) events.

2. Background of the Invention

The need for higher recording densities and wider bandwidth within the storage industry has been achieved by producing heads with thinner gap thicknesses, narrower track widths and the evolution of novel MR (magneto-resistive) and GMR (giant magneto-resistive) materials. This natural progression to smaller/thinner dimensions in a magneto-resistive head build-up has lead to the increased sensitivity at the wafer level to ESD events, which can destroy the device.

As semiconductor processing advances and devices grow smaller, the operational bias currents necessary to operate such devices decreases as well. This typically results in devices that are more sensitive to uncontrolled current flow, particularly spikes of high current.

For example, a typical MR head is built-up on an ceramic substrate like AlTiC (Aluminum Oxide Titanium Carbide). The head itself is comprised of both insulating and conducting layers that together can act as a capacitive device by storing and discharging potential. As the wafers are processed (handled) through the fabrication plant their insulated conductor properties allow themselves to become "tribocharged" when they come in contact with other insulating objects, such as those made with Teflon, PVC or non-dissipative plastic. Current vacuum wand tips are made from just such insulating materials and cannot be grounded. The act of charge exchange between two objects via friction is called tribocharging, which occurs when one object donates electrons and becomes positively charged and the other accepts electrons and becomes negatively charged.

It has been demonstrated that tribocharging with insulating materials can result in potentials of 20 kV on a wafer surface. Once a charged wafer comes in contact with a hard ground, such as a grounded conductor with relatively low resistance, the resulting "spike" in current flow as the wafer discharges itself can result in device failure. This ESD event results in typical yield losses of 10-20% per wafer and as high as 40-50% per wafer.

Thus, as wafers move through the fabrication process, they are constantly being handled—i.e. charged and discharged. Since all wafer handling cannot be eliminated from the wafer line, the typical fabrication setup would benefit from a way to safely discharge the wafers during handling and prior to contact with earth ground.

SUMMARY OF THE INVENTION

In a preferred embodiment, a grounded handler such as a wand or any type of end effector is used which has a surface and volume resistance sufficiently large so that charge potential is removed to ground at a controlled rate.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
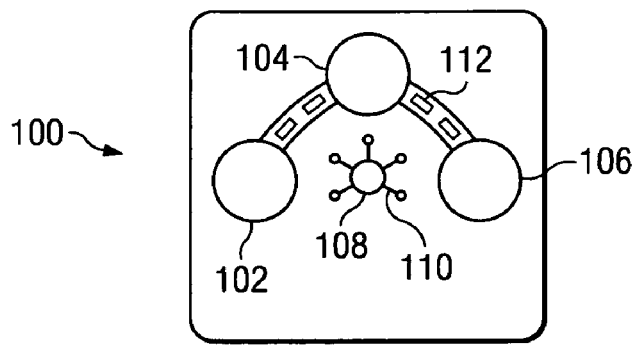
FIG. 1 shows a block diagram of a fabrication room consistent with implementing a preferred embodiment of the present invention.

The present invention is described with reference to the drawings. FIG. 1 shows a room of a fabrication plant where semiconductor devices are made. Such a fabrication plant typically includes multiple stations where wafers are processed. For example, FIG. 1 shows room 100 with stations 102, 104, 106 where wafers are placed during processing. Each station 102, 104, 106 performs a different function on a wafer, such as layering, deposition, etching, plating, patterning, photolithography, doping, heat treatment, and chemical mechanical polishing (CMP). Some stations may perform only part of a multi-step function on the wafer. Generally speaking, the wafer must be placed in several different stations during processing before the devices of the wafer are fully fabricated.

In order to move the wafer from station to station, the wafer must be handled. In some systems, robots with arms are used to handle wafers. In this example, robot 108 is positioned to move wafers from station to station. Robot 108 typically has one or more vacuum arms 110 for handling wafers. In prior art systems, such arms are typically insulated and are not grounded. Such insulators have surface and volume resistivities greater than $10^{12}$ ohms/sq and ohms/cm.

As stated, manual wafer handling is by vacuum wands or limited grasp tweezers. Vacuum wands are attached to a vacuum source and are usually designed to grasp the wafer from the backside to avoid damaging the sensitive front side of the wafer. Wafers can also be moved using boats or cassettes 112 that travel on belts or by other means. Wands 110 need not be part of a robot assembly, and can also be hand held, for example, whether the wafer is moved using wands or tweezers or boats, or other handling means, the handling devices are usually insulators and do not allow the wafer to discharge any accumulated charge to ground.

In a preferred embodiment, the present invention is a wafer-handling device such as a vacuum wand, tweezers, or boat or cassette that is grounded. To prevent harmful discharge of the wafer, the innovative handling device is made with a volume resistivity of $10^3$-$10^{10}$ ohms/cm, $10^6$ ohms/cm±2 orders of magnitude, such that any accumulated charge on the wafer may slowly discharge rather than (1) not discharging at all, causing the wafer to accumulate large amounts of charge; or (2) discharging very quickly, such as through a conductor, thereby risking damage to devices on the wafer.

Figure 2:
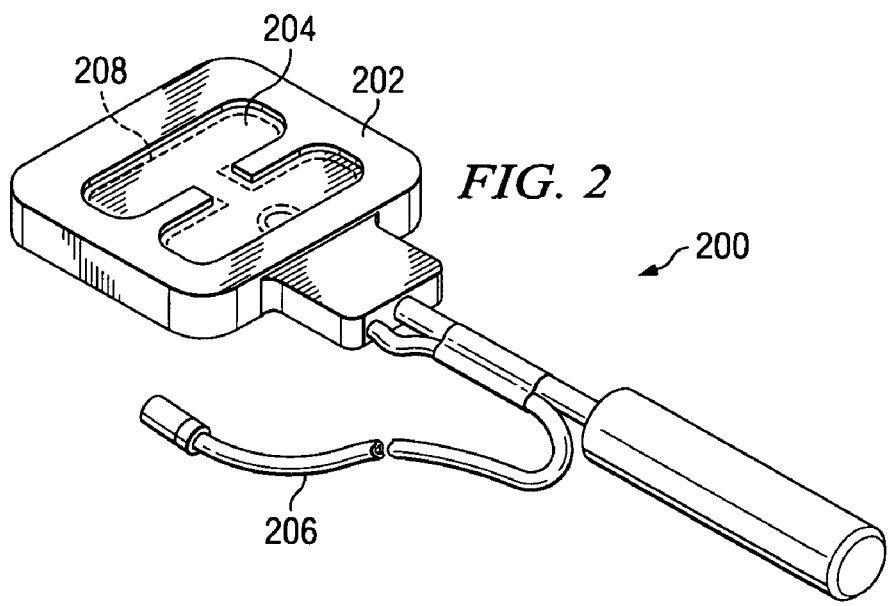
FIG. 2 shows a wand for handling wafers with grounding strap consistent with a preferred embodiment of the present invention.

FIG. 2 shows a detailed view of an innovative vacuum wand. In this embodiment, the wand 200 includes an ESD ceramic tip 202. Other materials that have been tried are called static dissipative PEEK™ or polyetheretherektone which is carbon loaded to make it conductive/dissipative, though such materials are used in less preferred embodiments of the present invention because of problems with hot spots or voids which are either to conductive or not conductive. Ceramic tip 202 includes cavities 204 for creating a vacuum seal with a surface, and a grounding strap 206 which is preferably made from a conductor and connected to a ground during use.

By providing a vacuum wand with resistance in the proper range along with a grounding strap or other means to ground the wand tip, significantly less charge is accumulated on a wafer because the wafer itself can remain discharged while not in use, and any charge picked up by the wand can slowly dissipate. Further, if the wand is used to pick up or handle a wafer that has already accumulated charge, that charge can be safely discharged from the wafer through handling the wafer with the innovative grounded vacuum wand. Thus, the present invention not only provides a means for protecting wafers that have accumulated charge, but it also provides a situation wherein wafers are less likely to accumulate charge to begin with.

Figure 3:
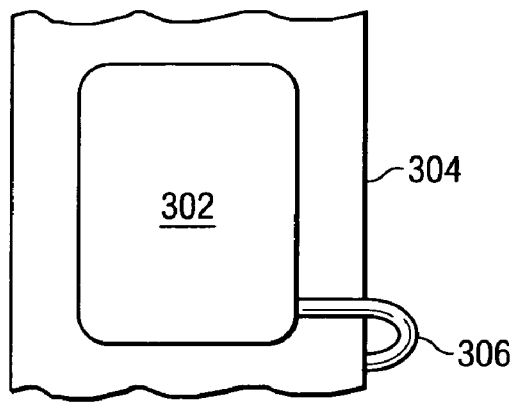
FIG. 3 shows a boat carrier for handling wafers with grounding strap consistent with a preferred embodiment of the present invention.

The same concept can be applied to tweezers or carriers of other kinds. For example, FIG. 3 shows a simple cassette or boat for carrying wafers in a device for fabricating wafers. In this example, boat 302 rides on conveyor belt 304. Boat 302 also has grounding strap 306 which connects boat 302 to a ground, such as a large metal part of the conveyor belt in this example, Boat 302 is preferably made from a ceramic material with a resistance in the range of $10^6$ ohms.

In other embodiments, handling surfaces are only coated with a grounded dissipative material, such as coating 208 shown in FIG. 2, so that electrically sensitive objects handled are not damaged. Other variations on the present invention can also be implemented without deviating from the scope of the present invention.

The innovative device of the present invention is not limited in application to wafer fabrication, though that is the context in which it is described herein. It should be understood by those of ordinary skill in the art that such an innovative device could be used to handle various electrically sensitive items in various environments.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A device for handling an electrically sensitive object, comprising:

a handling portion for touching the electrically sensitive object;

a grounding strap for connecting the handling portion of the device to ground;

wherein the handling portion has a sufficiently large resistance to allow electrical discharge of any accumulated charge of the electrically sensitive object without damaging the electrically sensitive object.

2. The device of claim 1, wherein the handling portion is made of a ceramic.

3. The device of claim 1, wherein the handling portion has a volume resistivity between about $10^5$ ohms/cm and about $10^6$ ohms/cm.

4. The device of claim 1, wherein the device is a vacuum wand for handling semiconductor wafers.

5. The device of claim 1, wherein the device is a wafer carrier.

6. The device of claim 1, wherein the object is selected from the group consisting of a magneto-resistive wafer and a giant magneto-resistive wafer.

7. The device of claim 1, wherein the handling portion includes a grounded layer of a dissipative material such that charged objects handled by the handling portion will discharge without damaging the object.

8. A method for handling electrically sensitive objects, comprising the steps of:

grounding a handling portion of a device, wherein the handling portion includes means for handling an electrically sensitive object and wherein the handling portion has a sufficiently large resistance to allow electrical discharge of any accumulated charge of the electrically sensitive object without damaging the electrically sensitive object; and handling an electrically sensitive object with the handling portion of the device such that the object is discharged of any accumulated charge without damaging the electrically sensitive object.

9. The method of claim 8, wherein the handling portion is made of a ceramic.

10. The method of claim 8, wherein the handling portion has a volume resistivity between about $10^5$ ohms/cm and about $10^6$ ohms/cm.

11. The method of claim 8, wherein the means for handling an electrically sensitive object comprises a vacuum wand tip.

12. The method of claim 8, wherein the device is a vacuum wand for handling semiconductor wafers.

13. The method of claim 8, wherein the device is a wafer carrier.

14. The method of claim 8, wherein the object is selected from the group consisting of a magneto-resistive wafer and a giant magneto-resistive wafer.

15. The method of claim 8, wherein the handling portion includes a grounded layer of a dissipative material such that charged objects handled by the handling portion will discharge without damaging the object.

\* \* \* \* \*